United States Patent
Miyazaki et al.

(10) Patent No.: US 9,983,286 B2
(45) Date of Patent: *May 29, 2018

(54) SAR REDUCTION IN FAST ADVANCED SPIN ECHO (FASE) OR SINGLE-SHOT FAST SPIN ECHO (SS-FSE) IMAGING

(71) Applicant: TOSHIBA MEDICAL SYSTEMS CORPORATION, Tochigi (JP)

(72) Inventors: Mitsue Miyazaki, Des Plaines, IL (US); Xiangzhi Zhou, Vernon Hills, IL (US); Yoshimori Kassai, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 993 days.

This patent is subject to a terminal disclaimer.

(21) Appl. No.: 14/312,121

(22) Filed: Jun. 23, 2014

(65) Prior Publication Data

US 2015/0369891 A1    Dec. 24, 2015

(51) Int. Cl.
| | |
|---|---|
| *G01V 3/00* | (2006.01) |
| *G01R 33/561* | (2006.01) |
| *G01R 33/563* | (2006.01) |
| *G01R 33/28* | (2006.01) |
| *G01R 33/48* | (2006.01) |
| *G01R 33/567* | (2006.01) |

(52) U.S. Cl.
CPC ........ *G01R 33/5617* (2013.01); *G01R 33/288* (2013.01); *G01R 33/4822* (2013.01); *G01R 33/5635* (2013.01); *G01R 33/5673* (2013.01)

(58) Field of Classification Search
CPC ................................................. G01R 33/5617
USPC ........................................ 324/309, 307, 306
See application file for complete search history.

(56) References Cited

U.S. PATENT DOCUMENTS

| | | | | |
|---|---|---|---|---|
| 9,414,765 | B2 * | 8/2016 | Miyazaki | ............... A61B 5/055 |
| 9,720,064 | B2 * | 8/2017 | Zhou | .................. G01R 33/5635 |
| 2012/0296199 | A1 * | 11/2012 | Kim | .................... G01R 33/5635 |
| | | | | 600/419 |

(Continued)

OTHER PUBLICATIONS

Mugler, III et al., "Practical Implementation of Optimized Tissue-Specific Prescribed Signal Evolutions for Improved Turbo-Spin-Echo Imaging", Proc. Intl. Soc. Mag. Reson. Med. 11 (2003), p. 203.

(Continued)

*Primary Examiner* — Louis Arana
(74) *Attorney, Agent, or Firm* — Nixon & Vanderhye P.C.

(57) ABSTRACT

A magnetic resonance imaging (MRI) system, method and/or computer readable medium is configured reduce specific absorption rate (SAR) in Fast Advanced Spin Echo (FASE) or Single-shot Fast Spin Echo (SS-FSE) imaging used, for example, in non-contrast magnetic resonance angiography (NC-MRA) techniques like fresh blood imaging (FBI). Within RF pulse sequences used to acquire echo data, the refocusing flip angles may be varied in the phase encode direction, and/slice encode direction, such that the refocusing pulse (or pulses) that map echo signals to the k-space center region larger refocusing flip angles than refocusing pulses used to generate echo signals that map to other areas of k-space. In some instances, the TR interval also may be varied for RF pulse sequences such that central K-space have a longer TR than the slices further towards the ends.

20 Claims, 9 Drawing Sheets

(56) References Cited

U.S. PATENT DOCUMENTS

2016/0033610 A1* 2/2016 Srinivasan ........... G01R 33/482
324/309

OTHER PUBLICATIONS

Hennig et al., "Multiecho Sequences with Variable Refocusing Flip Angles: Optimization of Signal Behavior Using Smooth Transitions between Pseudo Steady States (TRAPS)", Proc. Intl. Soc. Mag. Reson. Med. 10 (2002).

Miyazaki et al,, "Non-Contrast-Enhanced MR Angiography Using 3D ECG-Synchronized Half Fourier Fast Spin Echo", Journal of Magnetic Resonance Imaging 12:776-783 (2000).

Miyazaki et al., "Peripheral MR Angiography: Separation of Arteries from Veins with Flow-spoiled Gradient Pulses in Electrocardiography-triggered Three-dimensional Half-Fourier Fast Spin-Echo Imaging", Radiology Jun. 2003, pp. 890-896.

Scott et al., "Space: An Innovative Solution to Rapid, Low SAR, T2-Weighted Contrast in 3D Spin Echo Imaging", www.siemens.com/magnetom-world, Magnetom Flash Feb. 2005, pp. 92-95.

Nema Standards Publication MS Aug. 2008, Characterization of the Specific Absorption Rate for Magnetic Resonance Imaging Systems, National Electrical Manufacturers Association, pp. i-vi and 1-15.

Nakamura et al., "Noncontract-enhanced Peripheral MRA: technical Optimization of Flow-Spoiled Fresh Blood Imaging for Screening Peripheral Arterial Diseases", Magnetic Resonance in Medicine 65:595-602 (2011).

* cited by examiner

SAR REDUCTION IN FAST ADVANCED SPIN ECHO (FASE) OR SINGLE-SHOT FAST SPIN ECHO (SS-FSE) IMAGING

FIELD

The subject matter below relates generally to magnetic resonance imaging (MRI). In particular, the subject matter relates to reducing the specific absorption rate (SAR) in Fast Advanced Spin Echo (FASE) (also known as Single-shot Fast Spin Echo (SS-FSE)) imaging.

DETAILED DESCRIPTION

Figure 1:
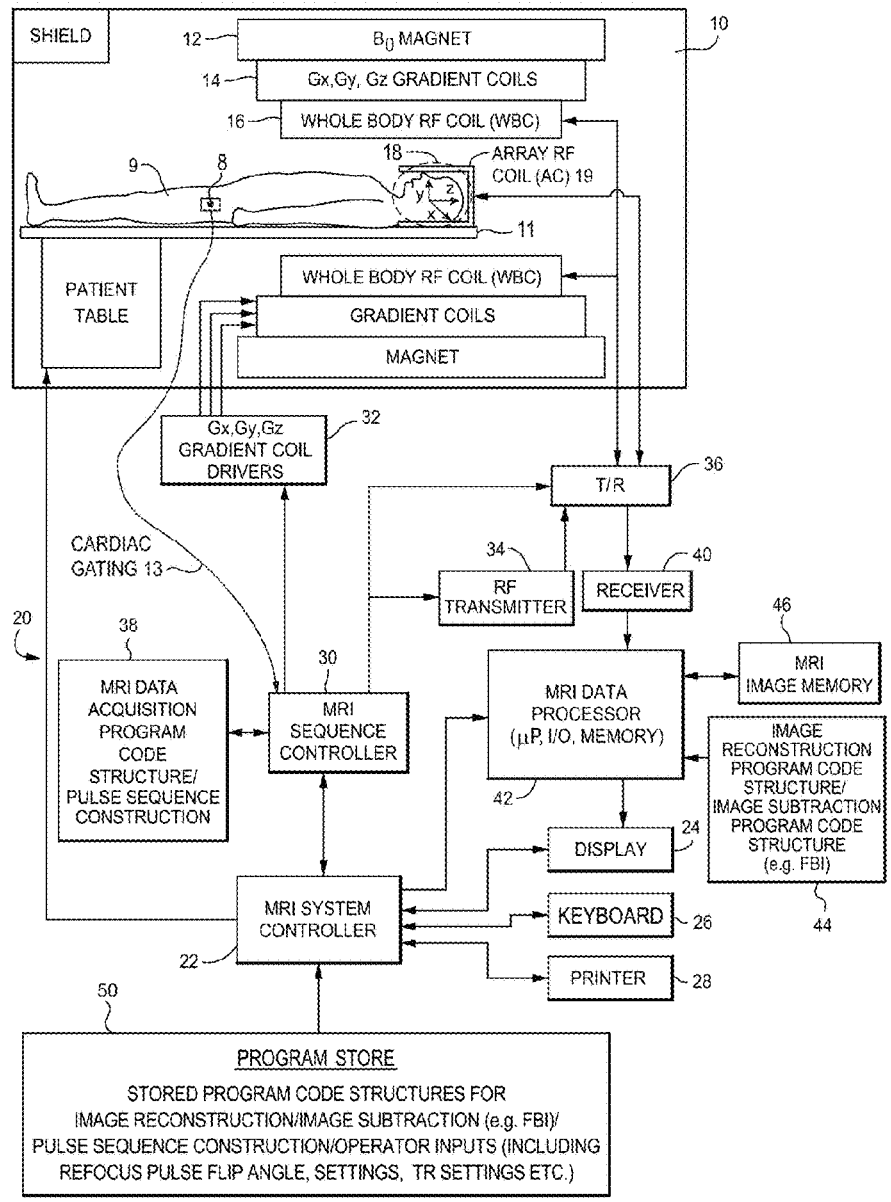
FIG. 1 is a high-level schematic block diagram of an MRI system adapted for reducing the SAR in FASE imaging, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. One or more smaller array RF coils 19 might be more closely coupled to the patient head in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume. A cardiac signal acquisition apparatus 8 (positioned as appropriate on the patient anatomy) may be used to provide peripheral pulsatile and/or cardiac gating signals 13 to trigger the MRI sequence controller 30.

An MRI system controller 22 has input/output ports connected to a display 24, keyboard 26 and printer 28. As will be appreciated, the display 24 may be of the touch-screen variety so that it provides control inputs as well and a mouse or other I/O device(s) may be provided.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques, which may also include parallel imaging. As described below, sequence controller 30 may be configured to apply predetermined pulse sequences and/or pulse sequences formed in accordance with configuration parameters, in order to obtain NMR echo data ("echo data") from which a diagnostic MRI image is obtained. In some embodiments the pulse sequences may be, or may be similar to, Fast Advanced Spin Echo (FASE) technique which is also known as single-shot Fast Spin Echo (SS-FSE). MRI sequence controller 30 may be configured to, using cardiac gating signals from cardiac signal acquisition device 8, transmit a pulse sequence towards an area of the patient in order to separately acquire echo data corresponding to a systole and a diastole, such that a difference image can be obtained. MRI sequence controller 30 may also be configured for EPI imaging and/or parallel imaging. Moreover, MRI sequence controller 30 may facilitate one or more preparation scan (prescan) sequences, and a scan sequence to obtain a main scan MR image (sometimes referred to as the diagnostic image).

The MRI system 20 includes an RF receiver 40 providing input to data processor 42 so as to create processed image data, which is sent to display 24. The MRI data processor 42 is also configured for access to previously generated MR data, images, and/or maps, and/or system configuration parameters 46, and MRI image reconstruction/subtraction program code structures 44 and 50.

Also illustrated in FIG. 1 is a generalized depiction of an MRI system program store 50 where stored program code structures (e.g., for image reconstruction, for generation of subtracted image, etc. as described below, for simulation of selected MRI image characteristics, for post-processing MRI etc.) are stored in non-transitory computer-readable storage media accessible to the various data processing components of the MRI system. Program code may also be stored for obtaining operator input, including, for example, pulse sequence configurations including refocusing flip angle configurations for refocusing pulses in pulse sequences such as FASE, TR interval settings etc. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes the generation of a subtracted image from control and tagging images, as described below, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Contrast-enhanced MR techniques are routinely used in clinical settings for angiography and often provide high contrast images at fast scan times. But contrast-enhanced techniques require the infusion of a contrast agent into the patient's body. Also, achieving clear artery and vein separation, particularly in the lower extremities of the human body where arterial and venous phases can overlap, remains an area of active research in terms of the amount of contrast material and injection rate. Thus, for magnetic resonance angiography (MRA) and for many other scanning applications, non-contrast-enhanced techniques that do not use a contrast agent are useful.

3D Fast Advanced Spin Echo (FASE; FASE is also known as single-shot FSE or SS-FSE) is a frequently used sequence for non-contrast-enhanced magnetic resonance angiography (NC-MRA). 3D NC-MRA, when used, for example, with cardiac gating in fresh blood imaging (FBI), provides images where blood vessels have high signal intensity, such as in T2-weighted images.

Miyazaki et al, in "Non-Contrast-Enhanced MR Angiography Using 3D ECG-Synchronized Half-Fourier Fast Spin Echo," Journal of Magnetic Resonance Imaging, 12:776-783 (2000) (hereafter "Miyazaki-1") which is hereby incorporated by reference in its entirety, describes an NC-MRA FBI technique using an in-plane 3D half-Fourier FSE synchronized with ECG gating at every slice encoding. Miyazaki-1 describes that several aspects of the half-Fourier FSE contribute to the effectiveness of the NC-MRA FBI technique at producing bright blood depictions, as opposed to the "black blood" images produced by many FSE-related sequences. The reduction in the echo train spacing (ETS) length, the phase-encode direction being placed in the orientation of the blood vessels, and signal acquisition from near the center or low frequencies of the k-space in half-Fourier FSE are some aspects that contribute towards obtaining bright-blood images.

The reduction in the ETS length in half-Fourier FSE reduces the single-shot acquisition time, which effectively freezes motion-related artifacts and minimizes susceptibility effects. As the ETS becomes shorter, the single-shot acquisition window of half-Fourier FSE becomes shorter. Thus, when half-Fourier reconstruction is applied, the single-shot acquisition time for a 256×256 matrix may be less than 1 second.

When the phase-encode direction is placed in the orientation of the blood vessels, signal enhancement is obtained from the overlapped T2 signal blurring between the neighboring pixels, contributing to the "bright blood" signal.

Additionally, because acquisition is from near the center or low frequencies of the k-space in half-Fourier FSE, less flow dephasing, due to the smaller gradient amplitude, is obtained in the phase encode direction compared with the read-out direction.

However, the vessel specificity depends, at least to some extent, on the trigger delay time such as systolic triggering (e.g., bright vein and dark artery) and diastolic triggering (e.g., bright in both artery and vein). In fast-flow vessels, the above FBI technique shows both arteries and veins as bright blood in diastole-triggered images, whereas the technique shows black-blood arteries and bright-blood veins in systole-triggered images. In general, the above FBI technique is applied with the phase-encode direction parallel to the orientation of the vessel, and therefore, it is straightforward to obtain images of only the arteries by subtracting the systolic image from the diastolic image of fast-flow vessels.

Somewhat different to the above, in peripheral or slow flow vessels, the above FBI technique provides bright-blood arteries even in systole-triggered images because of the slow flow, which makes it difficult to separate arteries from veins. Miyazaki et al, "Peripheral MR Angiography: Separation of Arteries from Veins with Flow-spoiled Gradient Pulses in Electrocardiography-triggered Three-dimensional Half-Fourier Fast Spin-Echo Imaging," Radiology, vol. 227, No. 3, June 2003, (hereafter "Miyazaki-2") which is hereby incorporated by reference in its entirety, provides a flow-spoiled gradient approach to use the above FBI technique to obtain good images for slow flow vessels. By applying the readout direction (instead of the phase encode direction) in parallel with the vessel orientation, an intrinsic dephasing effect is obtained. Furthermore, by applying flow-spoiled gradient pulses in the readout direction, a greater flow dephasing effect is obtained.

In other words, the flow-spoiled gradient pulses do not too much affect the signal intensities of relatively immobile blood during diastole or stationary background tissues. Therefore, subtraction of these two sets of diastolic and systolic images provides arterial images.

Flow-spoiled gradient pulses do not affect the signal intensity of stationary background tissues. In addition, veins are similarly less affected by the flow-spoiled pulses during diastole and systole as a result of their relatively constant slow flow throughout the cardiac cycle. Therefore, by applying the flow-spoiled pulses, the signal intensity difference between diastole and systole in arteries is increased. Thus, diastolic and systolic subtraction provides better delineation of the arteries. The strength of the flow spoiled gradient pulses may differ depending on the flow speed in the vessels: Arteries with slower flow necessitate use of stronger flow-spoiled gradient pulses to differentiate their signal intensities during diastole and systole.

According to Nakamura et al, "Noncontrast-enhanced Peripheral MRA: Technical Optimization of Flow-Spoiled Fresh Blood Imaging for Screening Peripheral Arterial Diseases," Magnetic Resonance in Medicine 65:595-602 (2011), which is incorporated hereby by reference in its entirety, the above described flow-spoiled FBI technique allows the depiction of the entire tree of peripheral arteries by utilizing the signal difference between systolic- and diastolic-triggered data. The image quality of the technique depends on selecting the accuracy of the triggering delay times and flow-dependent read-out spoiler gradient pulses. Nakamura et al illustrates that the flow-spoiled FBI technique offers good performance at 1.5 T.

However, although FBI at 1.5 T has been well established, FBI suffers from a specific absorption rate (SAR) issue and intrinsic prolonged T1 of tissue and blood at 3 T. More particularly, at 3 T (and/or other fields higher than 1.5 T) the intrinsic prolonged T1 of tissue and blood generally requires an extended TR interval in order to achieve sufficient signal to noise ratio (SNR) but, on the other hand, extending the TR interval results may result in extended scanning times.

Some embodiments described below, therefore, are directed to reducing the SAR in FBI techniques for NC-MRA such that adequate SNR is achieved. More particularly, in contrast to conventional NC-MRA techniques which apply refocusing pulses with a constant refocusing flip angle (also referred to as "refocusing pulse flip angle" or "flop angle"), embodiments provide for varying the refocusing flip angle during a TR interval such that the SAR can be maintained within a desired range while simultaneously enabling sufficiently large refocusing flip angles that produce echo data for the most important central region of k-space. The refocusing flip angles may be configured such that the variably-sized refocusing flip angles are symmetrically distributed about the refocusing pulse that corresponds to the center of k-space (e.g., the refocusing pulse that causes the generation of the echo signal that maps to the center of k-space). In some embodiments, for example, the refocusing flip angles may be varied as a function of how far in one or more directions from the center of k-space the corresponding echo signals are to be mapped. Moreover, some embodiments provide for varying the TR interval in addition to varying the refocusing flip angle, such that the central region of k-space can be populated based on echo signals acquired with sufficiently long TR while simultaneously ensuring that the total scan time is acceptable.

Conventional techniques vary refocusing flip angles in order to extend TE, to produce an echo train of constant amplitude, or to produce a smooth variation of echo amplitudes. For example, Scott et al, "SPACE: An Innovative Solution to Rapid, Low SAR, T2-Weighted Contrast in 3D Spin Echo Imaging," Magnetom Flash February 2005, describes controlling T2 contrast by using variable refocusing flip angles to replace constant refocusing flip angles in order to maintain the short T2 component with high signal. Scott et al., in its FIG. 1, illustrates a use of a pulse train with pulse amplitudes higher at the start and which slowly decrease to approach a constant ("asymptotic") value as low as 60 degrees, to obtain almost constant signal from a tissue of interest, for which the flip angles are optimized, by using prescribed signal evolutions.

In contrast to conventional techniques that are directed at T2 control with variable refocusing flip angles, embodiments maintain a high refocusing flip angle at the center of k-space and lower elsewhere. Some embodiments configure variable refocusing flip angles such that corresponding variable echo amplitudes are distributed symmetrically (or substantially symmetrically, because sometimes the effective TE echo may not be the mid point of the pulse train) about refocusing pulse that maps its echo to the k-space center. Moreover, embodiments apply variable refocusing flip angles in NC-MRA, such as NC-MRA FBI, environments where the SAR issues and scan time issues are more significant because, for example, of the acquisition of systole and diastole echo signals.

Figure 2:
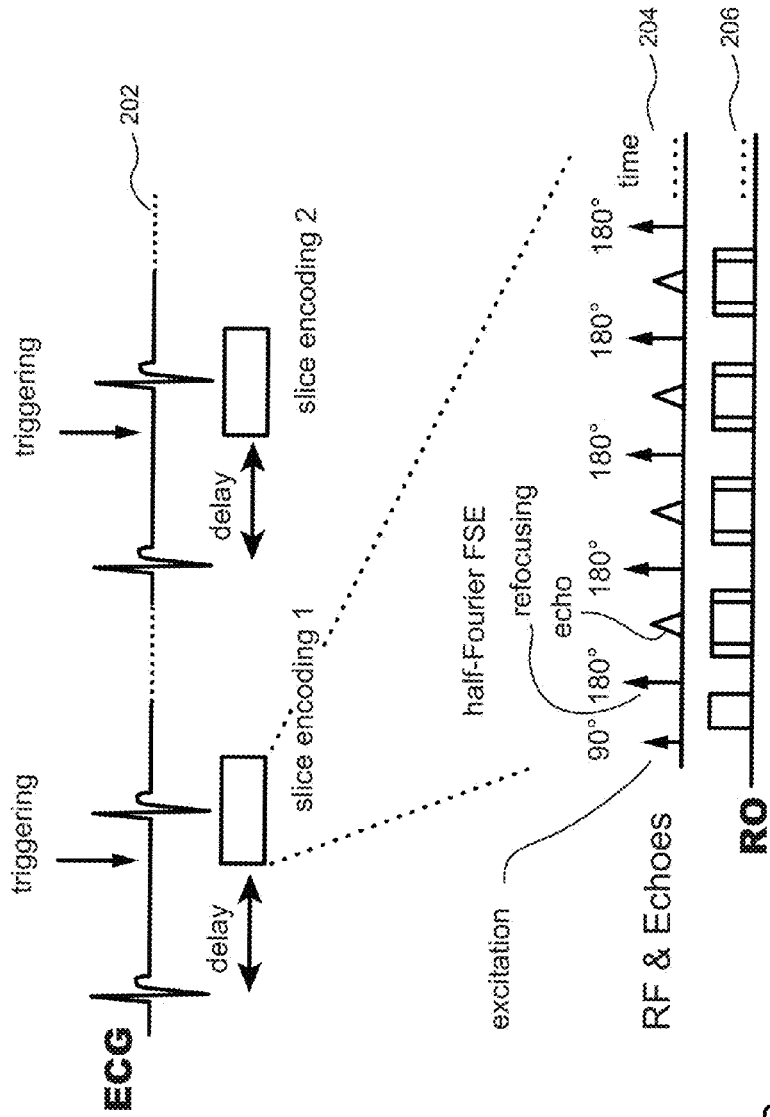
FIG. 2 illustrates a conventional pulse sequence used for FASE imaging.

FIG. 2 illustrates a conventional pulse sequence for FASE (or FSE), such as a pulse sequence used for the flow-spoiled FBI technique discussed above. ECG R-wave 202 is used for cardiac gating, such that data acquisitions for systole and diastole can be acquired at respectively consistent instances during cardiac cycles. Triggering points at which imaging data acquisition is initiated are also illustrated in relation to the R-wave. Data acquisition occurs after a lapse of a specified trigger delay period from an R-wave, and is conventionally configured to occur with a fixed predetermined interval (e.g., one data acquisition every 2 RR intervals). The 3D half-Fourier FSE sequence is ECG synchronized for each slice encoding to have the same cardiac phase in every slice partition. FIG. 2 illustrates a slice encoding 1 and a slice encoding 2 based upon R-waves 202, and also provides a schematic illustration of the RF pulse sequence and corresponding echo train 204, and the corresponding flow-spoiled gradients 206 in the readout direction.

Each triggering initiates a slice encoding by transmitting a pulse sequence, such as a FASE pulse sequence, towards the object being imaged. As illustrated, the RF pulse sequence for a slice encoding (e.g., slice encoding 1) includes one or more pulse trains in which a pulse train includes an excitation pulse and a plurality of consecutive refocusing pulses that follow the excitation pulse in time. The excitation pulse may be configured for a 90 degree excitation flip angle and each refocusing pulse is configured with a 180 degree refocusing flip angle. One resulting echo signal is acquired for each refocusing pulse. A person of skill in the art will understand, for example, that the strength (e.g., amplitude) of the echo can be changed by changing the refocusing flip angle. As those in the art will also understand, the amplitude, duration and frequency of the RF excitation and refocusing pulses contribute to the SAR.

FIG. 2 also illustrates gradients 206 applied in the readout direction in order to acquire the echo signals shown in 204. The illustrated gradients are flow-spoiled gradients which include flow-spoil regions to either side of the actual readout gradient. Miyazaki-2 further describes the flow-spoiled gradients, their configuration and effects.

Figure 3:
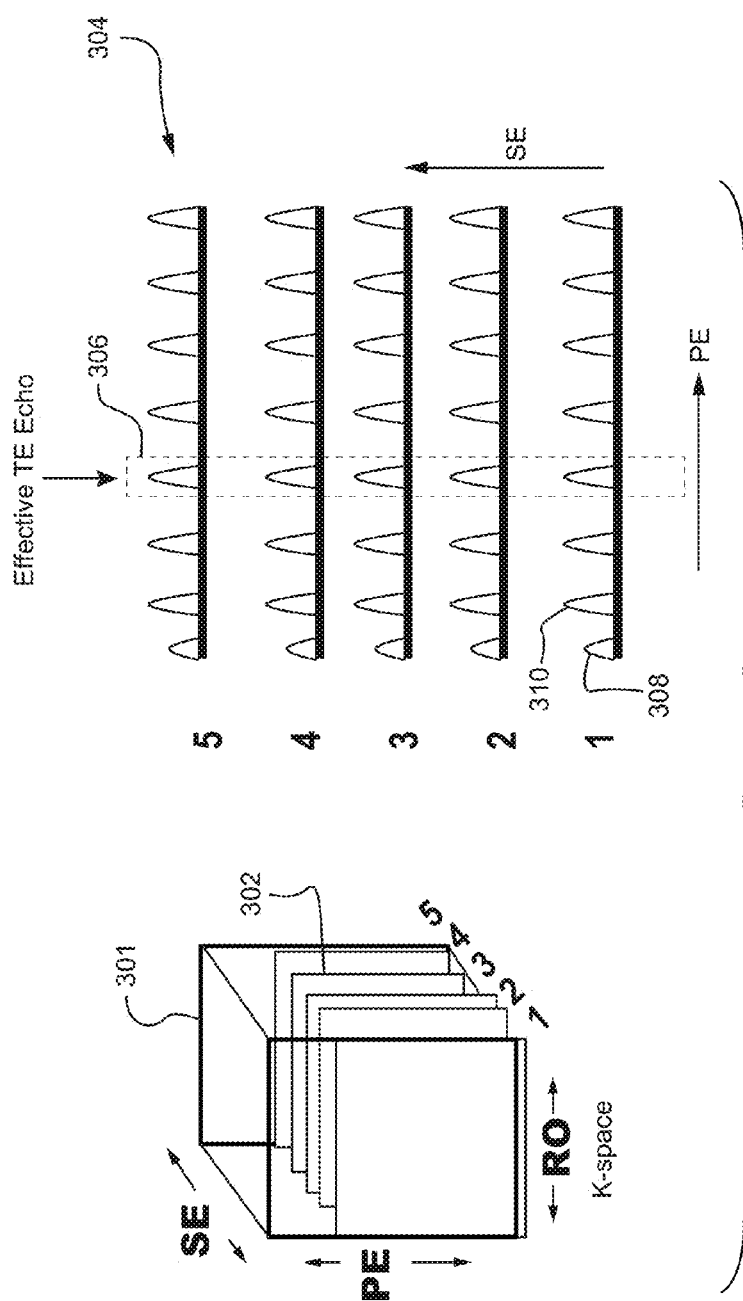
FIG. 3 is a schematic illustration of imaging slices in a k-space, and the conventional application of a FASE pulse sequence for each of the slices.

FIG. 3 schematically illustrates the conventional application of a FASE RF pulse sequence for each of the imaging slices 1-5 and the mapping of NMR echo signals corresponding to imaging slices 1-5 to k-space according to the conventional half-Fourier technique. K-space 304 is schematically depicted to include several slices 1, 2, 3, 4, 5, such as, slice 302. A readout direction, a phase encode direction, and a slice encode direction (e.g., kx, ky, kz, respectively) may be defined with regard to k-space. A 3D FASE sequence is applied to a volume of plural slices. Echo signal trains (not shown) are obtained in response to FASE pulse sequence 304 applied to respective slices (e.g., slices 1-5). Each FASE pulse sequence comprises an excitation pulse 308, and a plurality of subsequent refocusing pulses 310. As those in the art will appreciate, the PE and SE axes as shown schematically in FIG. 3 also have time domain coordinates. Within each slice 1-5, an echo train (not shown) is produced in response to the corresponding RF pulse sequence. The echo train generated for a particular RF pulse sequence includes a respective echo signal generated in response to each refocusing pulse. In a 3D FASE sequence, the effective TE for that single-shot sequence is preferably achieved at or very near the k-space center (i.e., the nearest to k-space center among echoes in the echo train). Note that FIG. 3 illustrates a conventional technique where all RF refocusing pulses have the same refocusing flip angle. If the refocusing flip angles are set too high, there may be an SAR issue which may require an elongated TR so as to avoid an excessive SAR. However, if the refocusing flip angles are too low, not enough SNR may be observed.

In 3D FBI imaging according to conventional techniques, especially at 3 T, the SAR becoming too high (e.g., beyond recommended/desired safety limits) is a problem. Whereas high refocusing flip angles are required in order to have a high SNR (e.g., to display "bright blood" with sufficient clarity) of blood vessels, SAR limitations restrict using high refocusing flip angles and/or elongate TR. As a result, scan time is lengthened.

In order to have a SAR within a desired range for a 3D FBI scan and yet maintain sufficiently high blood signal, embodiments herein use variable refocusing flip angles in a single-shot (e.g., in each or many slice encoding shots). The variable refocusing flip angles may have high refocusing flip angles(s) at or near the R-space center (e.g., for corresponding the respective slices) to maintain high blood vessel signals. At or near the center of R-space slice encoding, high refocusing flip angles are used and peripheral slice encoding has lower refocusing flip angle pulses. Some preferred embodiments apply the variable refocusing flip angles in 3D FASE sequences in both the phase encode direction and in the slice encode direction (i.e., 2D variation in refocusing flip angle pulses.

Variable refocusing flip angles of refocusing pulses can be arranged in any of many possible patterns, such as, for example: a pattern of variable refocusing flip angles in every shot; a high variable refocusing flip angle at the center of slice encoding and the rest of slice encoding using lower refocusing flip angles; a high variable refocusing flip angle at the center of slice encoding and the rest of slice encodings using somewhat moderate high variable refocusing flip angles; a high variable refocusing flip angle at the center of slice encoding areas and the rest of slice encodings using lower refocusing flip angles; and a high variable refocusing flip angle at the center of slice encoding areas and the rest of slice encodings using somewhat moderately high variable refocusing flip angles. In some embodiments, the refocusing pulses are configured such that variably-sized high refocusing pulse angles are distributed substantially symmetrically about the refocusing pulse for which the corresponding echo signal maps to the k-space center.

In contrast to conventional techniques, example embodiments provide advantages including, for example, reduced SAR due to smaller refocusing flip angles for some (e.g., the outer) k-space lines, maintaining sufficient SNR of blood signal because the center k-space lines use larger refocusing flip angles, and reducing TR—and thus reducing scan time.

Figure 4:
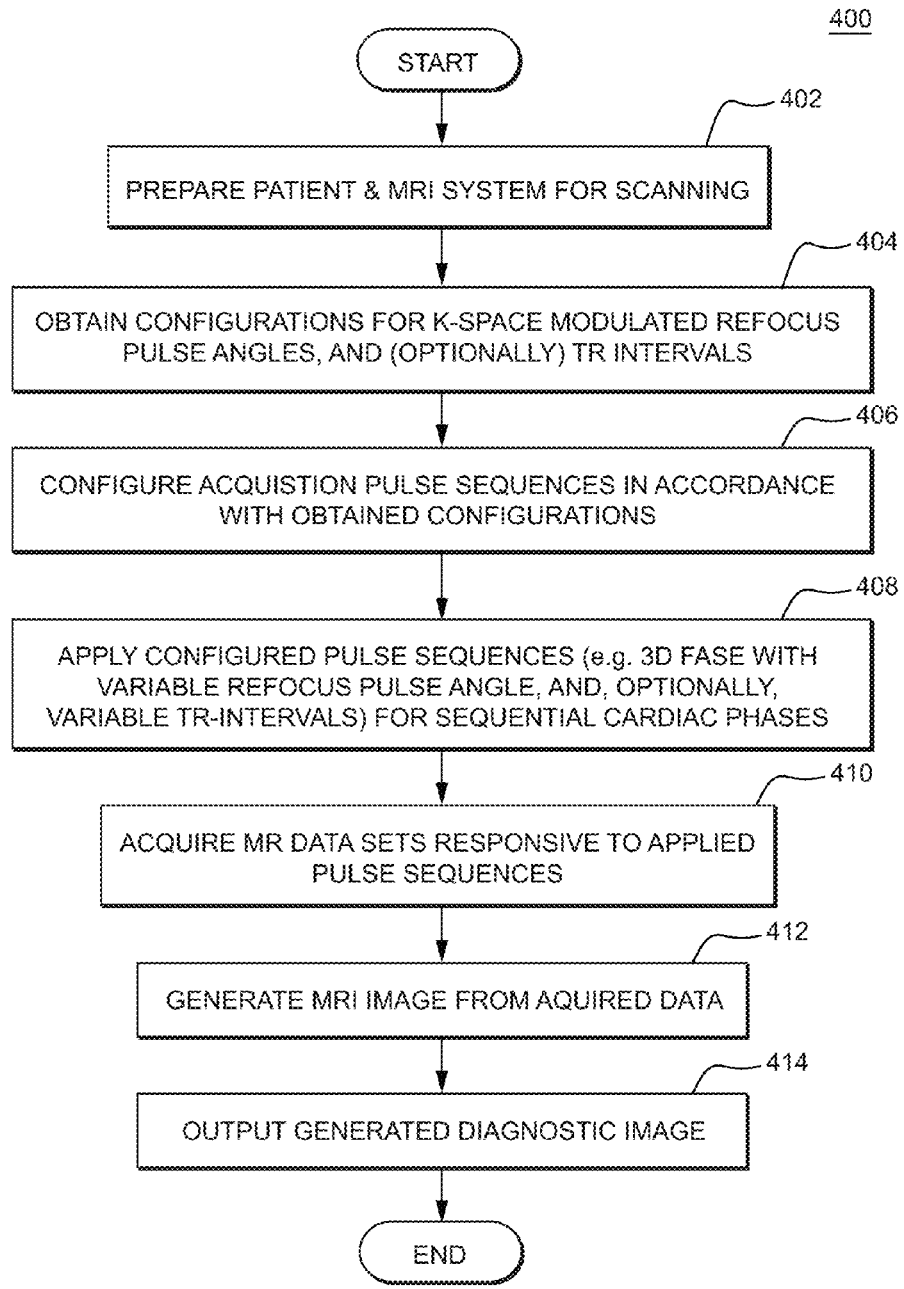
FIG. 4 illustrates a flowchart for reducing the SAR in FASE imaging, according to one or more embodiments.

FIG. 4 illustrates a flowchart of a process 400 for reducing the SAR in FASE imaging, for example, in FBI imaging, according to one or more embodiments. The process 400 may be performed by an MRI system, such as, for example, the MRI system shown in FIG. 1. It will be appreciated by those in the art that one or more of the operations 402-414 may be performed in an order other than that shown, may not be performed or may be combined with one or more other operations when performing process 400.

After entering process 400, at operation 402 the patient and the MRI system are prepared for scanning. Operation 402 may include positioning the patient and/or the part of the patient to be imaged in relation to transmit and/or receive RF coils of the MRI system, and setting of general parameters and/or configuration options for performing imaging. In example embodiments techniques described herein can be applied to image many parts of the patient, such as, but not limited to, head, neck, heart, lungs, kidneys, legs, iliac, femoral, calf, foot, hand and/or other areas in which blood vessels are to be examined, with appropriate configurations of the system and positioning of the patient. As described below, certain configurations, such as, for example, pulse sequences, slice locations and sizes, can be adjusted in a respective manner based upon selected characteristics of the object image. For example, configurations may be set and/or adjusted in accordance with the flow speed of the vessel or specific part of the body or organ being imaged.

The preparation stage may, in some embodiments, also include acquiring one or more prescans, for example, to obtain one or more low resolution MRI images for positioning the patient and/or coil calibration. In some embodiments, one or more ECG preparatory scans may be performed in order to determine appropriate ECG delay times for systole and diastole for the vessel(s) of interest (e.g. vessel(s)/area to be imaged) from the acquired images, and the selected delay time is later applied in the diagnostic 3D half-Fourier FSE acquisition synchronized by ECG gating for every slice encoding. In some embodiments, additional prescans may be performed, for example, to determine flow-spoiled gradient pulse strength based upon prescan images. Miyazaki-2 further describes preparation scans such as those noted above, which may be used in example embodiments.

At operation 404, configuration parameters are obtained for variable refocusing flip angles and related aspects. The operator may provide configurations associated with the variable refocusing flip angles by selecting from a pre-stored table of parameters and/or by use specifying a pattern of refocusing flip angles for one or more of a plurality of pulse sequences that are to be applied to respective slices and/or applied to respective sets of k-space lines for a single slice. Some embodiments may provide a user interface (UI) by which the operator can individually select one or more refocusing pulse angles in one or more provided FASE pulse sequences, and, individually or in groups, provide a refocusing flip angle for selected pulses. In some embodiments, the user may specify a refocusing flip angle for only the refocusing pulse corresponding to effective TE ($TE_{effective}$) for which the responsive echo signal will be recorded in the k-space center. The examples provided above are illustrative, but a person of skill in the art will appreciate that configurations related to the refocusing flip angles can be specified in many other ways.

Configuration parameters may also be obtained, optionally, for variable TR intervals. As noted above, the length of TR intervals too are a significant determining factor in the total SAR associated with a FBI scan. A TR interval, as the term is generally used in the art, is the time interval between two excitation pulses. In embodiments, all the refocusing pulses corresponding to a particular excitation pulse occur within a TR interval.

Variable TR intervals can be particularly advantageous where, for example, the k-space center slices (e.g., slices that overlap or are near the k-space center), due to large refocusing flip angles, an extended TR is required in order to keep SAR within desired limits. Shortening the TR interval would reduce scan time, but increase SAR associated with the scan and reduce the SNR. A longer TR interval would extend the scan time, but decrease SAR and increase the strength of the acquired signal d.

The operator may provide configuration parameters such that two or more different TR interval lengths are specified for encoding slices. A number or percentage of the slices to be encoded at each TR interval length may also be specified. In some embodiments, the user may identify a TR interval length for each slice.

At operation 406, acquisition pulse sequences are configured based upon the obtained configuration parameters. The pulse sequences are formed such that the refocusing pulses contributing to the central region of k-space having the largest refocusing flip angles. When considering a slice (e.g., a 2D plane), the center of k-space for the slice is the central region of the slice. When considering a plurality of slices (e.g., a stack of slices or 3D volume) the center of k-space is the center of the 3D volume. The refocusing pulses in each pulse sequence may be arranged so that (1) for each slice, the highest refocusing flip angles are assigned to the pulses closest to the center k-space, the lowest refocusing flip angles are assigned to the pulses furthest from the center k-space, and/or intermediate refocusing flip angles are assigned to pulses such that the size of the refocusing flip angle does not increase going from the center to the peripheries of k-space, and (2) between slices, slices at the 3D center k-space have the largest refocusing flip angles, whereas slices at the peripheries have the smallest refocusing flip angles, and/or the refocusing flip angles at the 2D center of slices do not increase going from the center k-space to the peripheries. Other arrangements of variable refocusing flip angles and variable TR intervals are possible and are contemplated as embodiments. For example, arrangements may be provided where, while the k-space center region does include echo data from high refocusing flip angles one or more other areas outside of the center region may also include echo data from high refocusing flip angles (e.g., when such a configuration is still within the acceptable SAR ranges and scan times).

The forming of the pulse sequences in accordance with configuration parameters may be achieved by using one or more predetermined lookup tables stored in the memory of a computer associated with the MRI system (e.g., predetermined lookup table storing default refocusing flip angles for any refocusing pulse and/or respective refocusing pulses of a pulse sequence), by using a predetermined algorithmic function to determine refocusing flip angles for respective refocusing pulses when one or more of a maximum refocusing flip angle, a minimum refocusing flip angle, and a number of refocusing pulses are specified, or by using pulse sequences as they were specified by users (e.g., where the operator specified refocusing flip angles for one or more selected refocusing pulses, and the others have predetermined default values).

If the operator indicated that variable TR intervals are also to be configured, the pulse sequences are further configured so that the slices nearest the 3D center of k-space have the largest TR intervals. Further configuration may provide for slices at the peripheries having the shortest TR interval and/or those in between being arranged such that the slice TR intervals do not increase going from the center to the peripheries.

At operation 408, the configured pulse sequences are applied. The application may include applying each pulse sequence twice to a slice—a first time to obtain echo signals for the systole and a second time to obtain echo signals for diastole. The application may include transmitting RF pulses according to 3D FASE pulse sequence(s), as configured at operation 406, towards a selected area of the patient.

At operation 410, echo signals responsive to the applied pulse sequence(s) are collected. Persons of skill in the art will appreciate that operations 408 and 410 are performed in a manner that for any number of the pulse sequences applied, the corresponding responsive echo signals can be collected. In some embodiments, all echo data required for half-Fourier reconstruction is acquired by applying one pulse sequence separately for systole and diastole. In some other embodiments, more than one pulse sequence may be applied in order to obtain all echo data required for half-Fourier acquisition of k-space.

The acquisition stage, in some embodiments, results in a data set for an image captured in the systolic phase and a data set for an image captured in the diastolic phase of the same cardiac cycle. According to some embodiments, the systole and diastole echo signals are collected in separate memory areas, representing respective k-spaces (e.g., each capable of providing data for a complete, albeit non-final, MR image).

At operation 412 the diagnostic image is generated. The diagnostic image may be created by subtracting the systolic image, derived from the data set acquired for the systole, from the diastolic image derived from the data set acquired for the diastole, or vice versa.

At operation 414, the generated diagnostic image is output. The generated image may be displayed to an operator on a display of the MRI system and/or on a remote display, may be printed, may be stored on a local or remote data storage device, or may be provided for further MRI processing.

Figure 5:
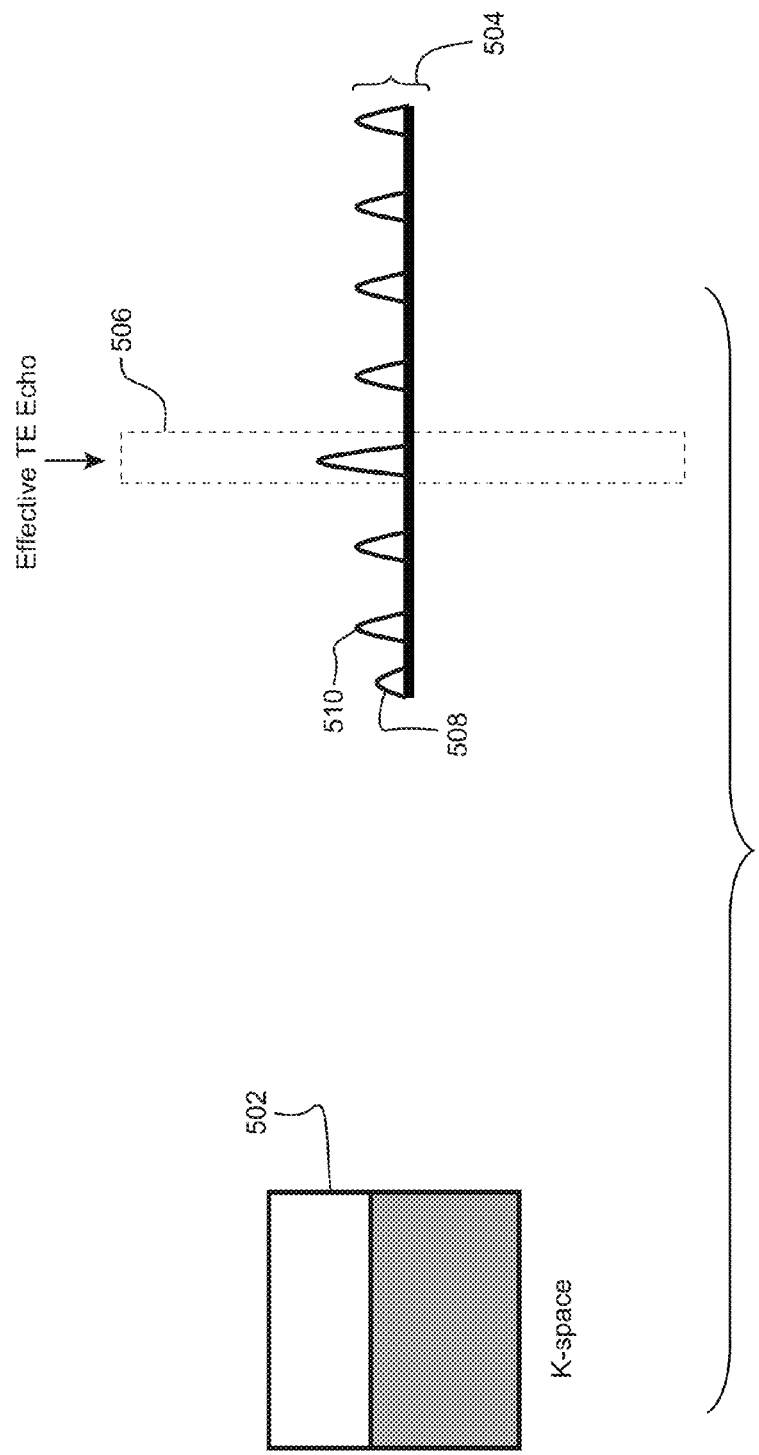
FIG. 5 schematically illustrates a k-space filled with nuclear magnetic resonance (NMR) echo data based on the half-Fourier technique, and the NMR echo signals, in accordance with one or more embodiments.

FIG. 5 schematically illustrates a k-space 502 half-plus filled with NMR echo data according to a half-Fourier technique. The shaded area of k-space 502 includes the echo data acquired for one slice. According to an embodiment, RF pulse FASE sequence 504 is applied to an object being imaged, and an echo train (not shown) is generated with a respective echo being generated in response to each refocusing pulse in the FASE sequence. FASE sequence 504 includes an excitation pulse 508, and a plurality of subsequent refocusing pulses, such as 510. An echo train comprising a respective echo produced in response to each refocusing pulse is produced. One of the RF refocusing pulses 506 is identified as causing the echo signal mapped to the center of k-space (e.g. effective TE echo) has a larger refocusing angle than other refocusing pulses because of its encoding to the important center of k-space. As described above, as the refocusing flip angle gets larger, the corresponding echo signal becomes stronger (i.e., higher amplitude) and SNR increases.

As illustrated in FIG. 5, each 2D FASE single-shot may have a k-space modulated refocusing flip angle pattern which provides for the refocusing flip angle of the effective TE echo at k-space center. In the illustrated example, the RF refocusing angle at the center of k-space is set high, and the other RF refocusing angles are set relatively lower. The total number of RF refocusing pulses with high refocusing flip angle at k-space center may be configurable.

Figure 6:
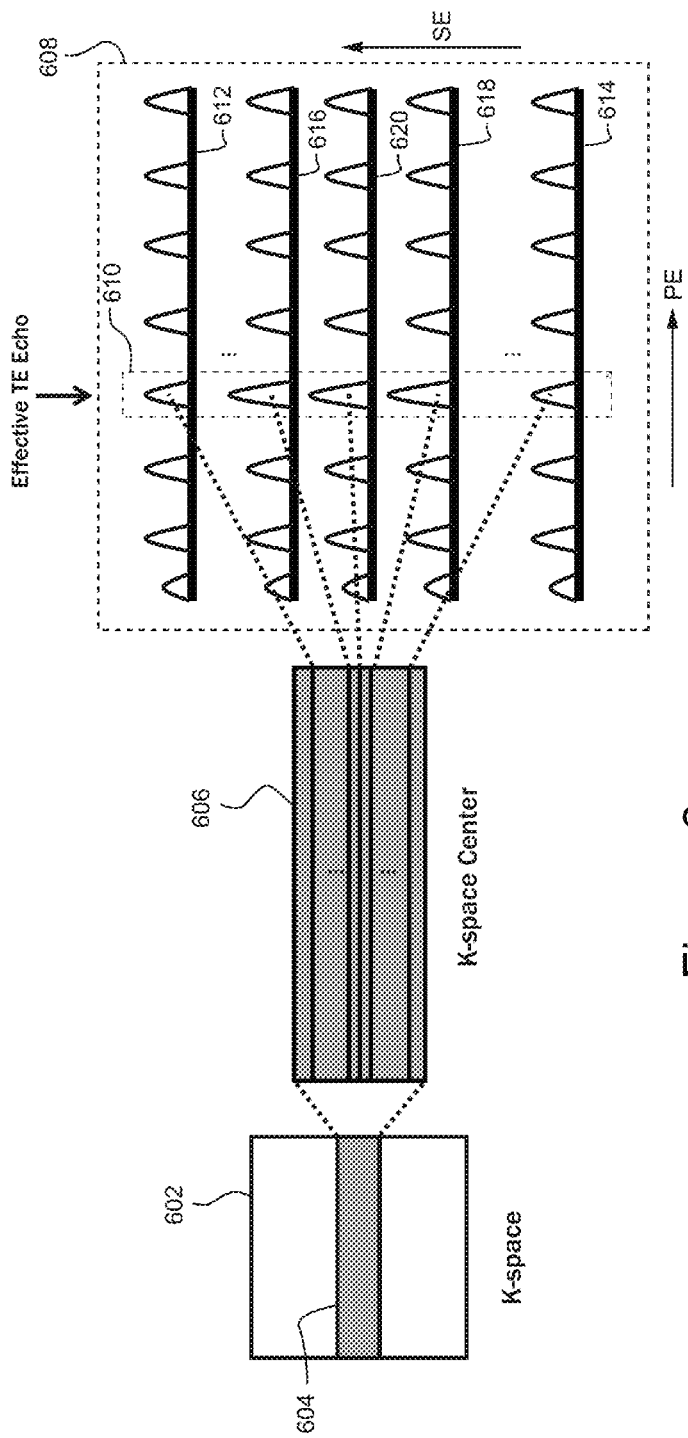
FIG. 6 schematically illustrates a center area in k-space for a slice, where effective TE echoes are stored, and mapping of echo sequences to the k-space, in accordance with one or more embodiments.

FIG. 6 schematically illustrates a center area 604 in k-space 602 where effective TE echoes corresponding to refocusing pulses 610 from a plurality of FASE pulse sequences 608 are recorded. The echo signals corresponding to effective TE from each of the FASE pulse sequences 612, 614, 616, 618, and 620 are mapped to the center k-space region as shown in the expanded view 606 of center area 604. As shown, the 2D FASE pulse sequence forms a pattern for variable refocusing flip angles such that the effective TE echo 610 having a high SNR can be obtained while yet reducing SAR by elsewhere using smaller refocusing flip angles. In the illustrated embodiment, the refocusing pulses providing the three lines nearest the center of k-space were assigned the same high refocusing flip angle while the lines more removed from the center k-space have smaller angle RF refocusing pulses. However, any pattern including high (or highest) refocusing flip angle being in center k-space may be configured.

Figure 7:
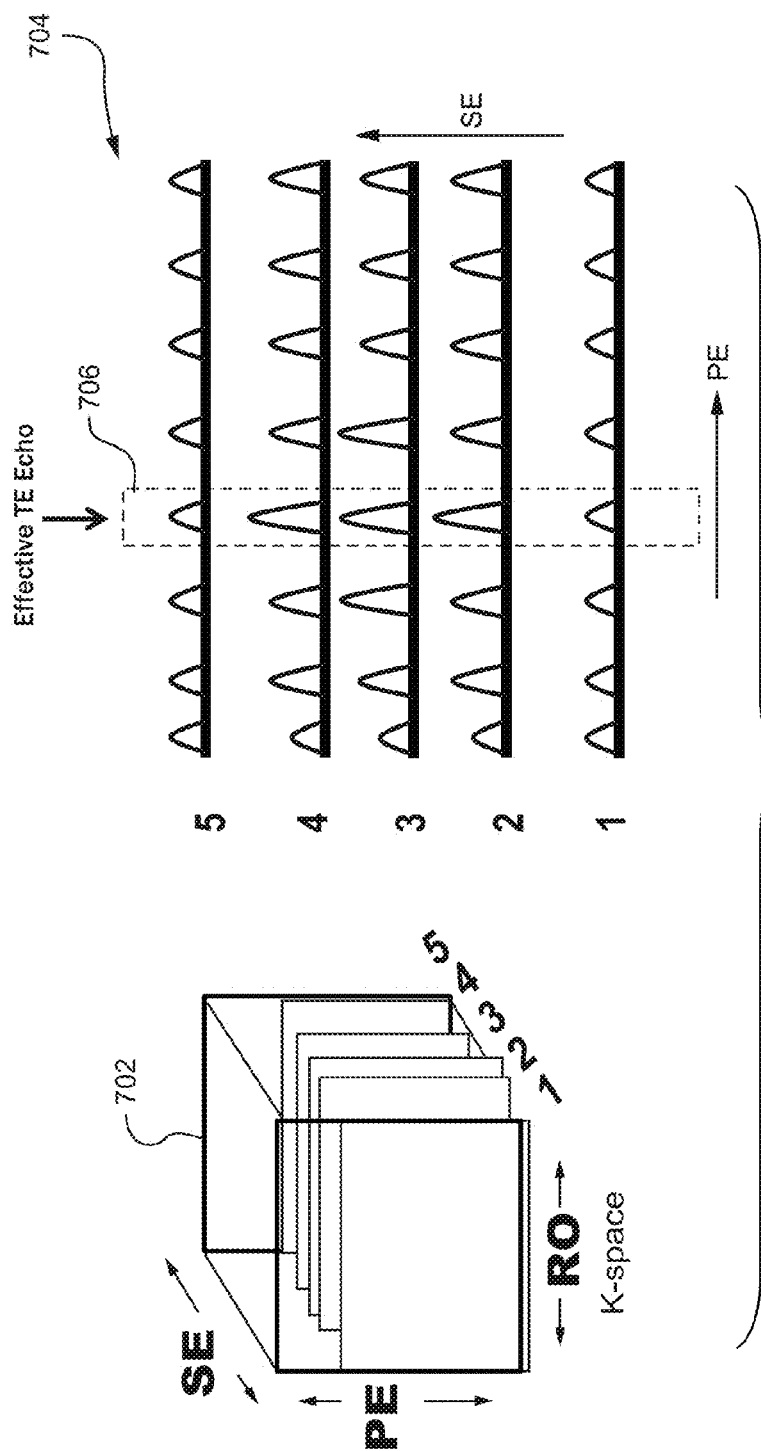
FIG. 7 schematically illustrates some effects that refocusing pulses with variable refocusing flip angles has on the generated echo signal trains, in accordance with one or more embodiments.

FIG. 7 also schematically illustrates variable refocusing flip angles applied in both the phase encoding and slice encoding directions. In order to have a signal with sufficiently high SNR for blood, high refocusing flip angles are used for refocusing pulses that map their respective echoes to the center of k-space in both PE and SE directions. A k-space 702 comprising five half-Fourier slices identified as slices 1-5. NMR echo signals corresponding to slices 1-5 are generated in response to FASE pulse sequences 704 (i.e., echo trains responsive to FASE pulse trains 1, 2, 3, 4, and 5 are used to fill slices 1, 2, 3, 4, and 5, respectively, according to the half-Fourier technique). Slice 3, is located in the center of k-space in the slice encode (SE) direction. Thus, the mid-point of slice 3 (i.e., the point of intersection, on a plane in slice 3, of mutually orthogonal axis from the mid-points of the phase encode (PE) direction and the readout (RO) direction) represents the center of 3D k-space. Accordingly, effective TE echo of slice 3 is encoded to the center of 3D k-space, and its corresponding refocusing pulse is configured to have the largest refocusing flip angle of the refocusing flip angles assigned to any of the refocusing pulses used on slices 1-5. Slices 2 and 4 are to either side of slice 3, and are therefore the closest, other than for slice 3, to the center of k-space in the SE direction. Therefore, in the embodiment illustrated in FIG. 7, the next largest (i.e., next largest compared to the refocusing pulse corresponding to the effective TE echo of slice 3) refocusing flip angle is assigned to one refocusing pulse to either side of the effective TE echo of slice 3 and the effective TE echoes of slices 2 and 4. Moreover, the refocusing flip angles for refocusing pulses of slices 2-4, which are nearer the center of 3D k-space, are configured to be larger than the refocusing flip angles for refocusing pulses of slices 1 and 5. As noted above, the relative sizes of the refocusing flip angles are represented by the amplitudes of the corresponding echo signals. The 3D pattern of refocusing flip angles shown in FIG. 7 can be conceptualized as a stepped hill on the PE, SE "plane". As will be appreciated as the number of steps is increased, the containers of the "hill" become more smoothly changing.

RF pulse sequences 704 for slices 1-5 may be configured, for example, as follows: all refocusing flip angles for slices 1 and 5 configured as 90 degrees; refocusing flip angles for slices 2 and 4 (except for the effective TE pulse) configured as 120 degrees; refocusing flip angles for slice 3 (except for effective TE pulse and one pulse to either side of the effective TE pulse) configured as 120 degrees; refocusing flip angles for effective TE pulse of slices 2 and 4 and for one pulse to either side of the effective TE pulse of slice 3 are configured as 150 degrees; and the effective TE pulse of slice 3 configured as 180 degrees. In an example embodiment, a k-space 702 may correspond to a 256×256×50 voxel scanned volume. Of course, due to the half-Fourier technique only part of that data need actually be acquired from the echo information.

Figure 8:
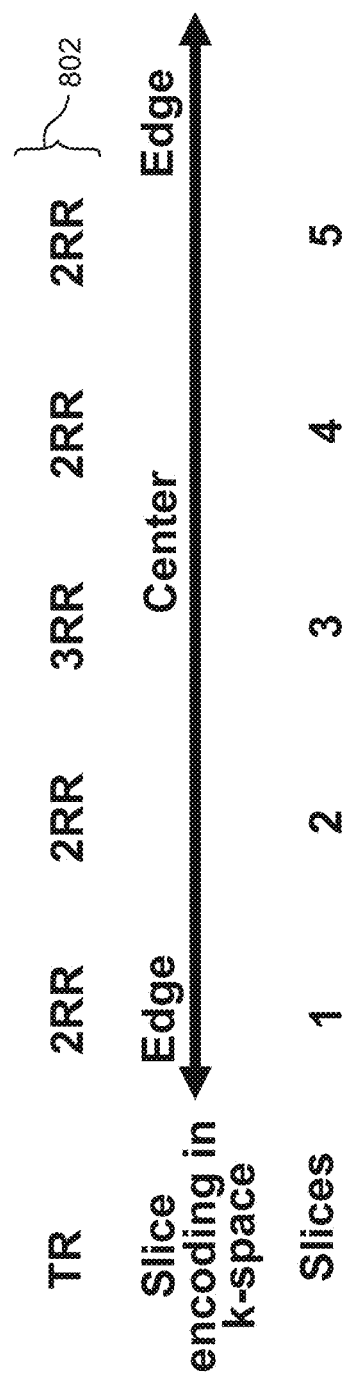
FIG. 8 illustrates a variable TR interval pattern that can be used in some embodiments in combination with a variable refocusing flip angle for refocusing pulses.

FIG. 8 illustrates a variable TR interval pattern 802 that may be used in some embodiments in combination with a variable refocusing flip angle for refocusing pulses. Pattern 802 illustrates that, in a 3D k-space where slices 1-5 are arranged sequentially (e.g., as shown in k-space 702), the FSE pulse sequences for each of slices 1 and 5, which are furthest from the k-space center are acquired with a TR interval of 2 RR, and slices 2-4 are each acquired with a TR interval of 3 RR. Thus, pattern 802 illustrates a 2 level variable TR interval arrangement where the slices closest to the k-space center are assigned the higher TR interval and the other slices being assigned the lower TR interval.

The total scan time is determined as the summation of times to acquire (e.g. encode) each of the slices being imaged. Thus, when a fixed TR is used for all slice encodings, then the total scan time is based upon the product of the summed TR intervals for one slice and the number of slices. When the TR intervals vary for some slices, then the total scan time is expressed as the summation of the TR intervals of the respective slices.

The TR interval, as used in some embodiments, include the delay from R-wave trigger, 3D FASE readout and the recovery time until the next R-wave trigger. In some example embodiments, the TR interval for selected slices is changed by changing the time to obtain the FASE readout. Specifically, in some embodiments, the interval between consecutive refocusing pulses (and correspondingly the interval between readout gradients) is changed such that in the shorter TR intervals the echo signal demonstrates less longitudinal magnetization recovery and in the longer TR intervals the echo signal demonstrates a stronger longitudinal magnetization recovery. Thus, TR with 3 RR between readouts gives higher longitudinal magnetization (Mz) recovery than 2 RR, however, TR with 3 RR between readouts requires longer scan time.

SAR is related to TR, and shorter TR makes higher SAR in an FBI scan. In FBI, the total scan time is proportional to the number of slice encodings and the TR for one total slice encoding. In conventional FBI, each slice encoding happens within a fixed TR. As noted above, TR includes the delay from R-wave trigger, 3D FASE readout and the recovery time until the next R-wave trigger. In conventional applications, TR is fixed at any of the lengths, such as, for example, 2 RR, 3 RR, 4 RR or 5 RR, and once a value for TR is set, the same TR will be used throughout the scan. Generally, the lower limit of number of RR depends on the SAR. For patient with high heart rate, extra RR is needed to reduce the SAR.

Figure 9:
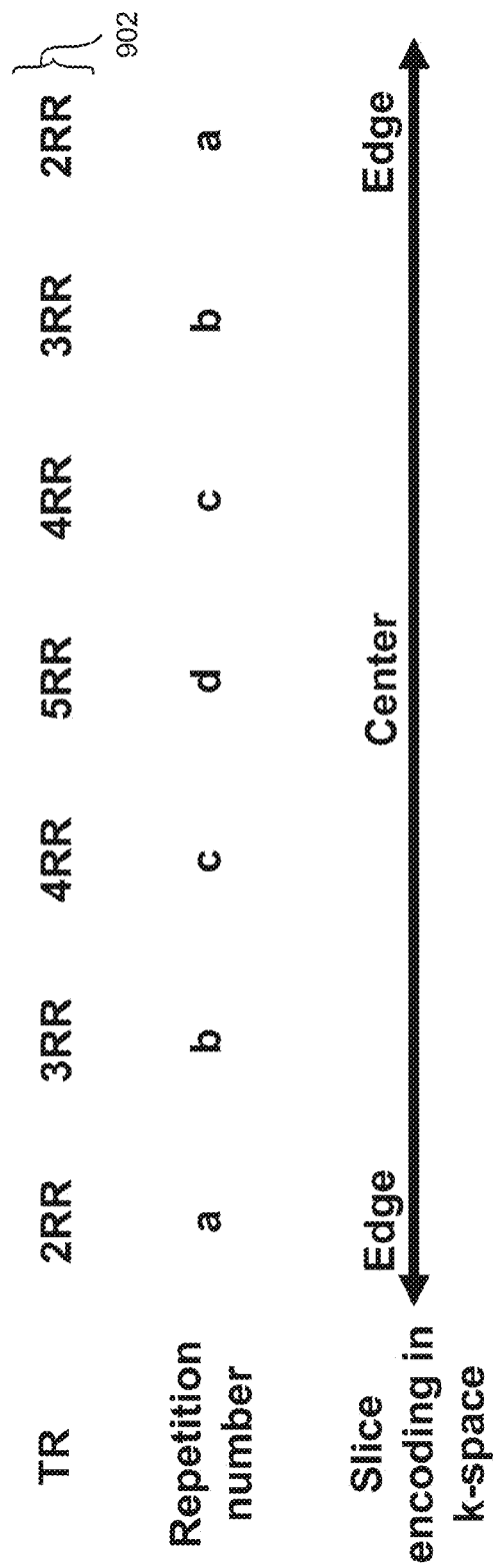
FIG. 9 illustrates another variable TR interval pattern that can be used in some embodiments.

FIG. 9 illustrates another variable TR interval pattern that can be used in some embodiments. The pattern 902 shown in FIG. 9 is a mufti-level pattern with more than two different TR intervals being used when encoding a plurality of slices. As shown in FIG. 9 the pattern 902 may include the longest TR interval (e.g., 5 RR) in the slice(s) nearest the center of k-space in the SE direction, and the other slices may be configured with non-increasing TR intervals as the slice position changes from the center of k-space to the peripheries or edges of k-space. As shown in FIG. 9, this general pattern of configuring the most central (to k-space) slices to have the largest TR interval, and the slices at the edges to have the smallest TR interval, can be generalized such that each TR is assigned to a predetermined number of consecutive slices. For example, in accordance with the "repetition number" series shown in FIG. 9, the d, most central (to k-space), slices are assigned a 5 RR TR, c consecutive slices to either side of the 5 RR slice(s) are assigned a TR of 4 RR, the next b consecutive slices after each set of 4 RR slices are assigned 3 RR, and a last slices at either side are assigned 2 RR. The changes to TR interval can be made in the phase encode direction and/or slice encode direction.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
   an MRI gantry having components including a static magnetic field generator, gradient magnetic field coils, at least one radio frequency (RF) coil configured to couple with an object located in an imaging volume, at least one RF transmitter and at least one RF receiver;
   an MRI sequence controller configured to control said gantry components so as to effect non-contrast magnetic resonance angiography (NC-MRA) of a three dimensional (3D) volume by:
      eliciting systolic and diastolic sequences of nuclear magnetic resonance (NMR) echoes, from the object, which map to a 3D k-space having phase-encoded (PE) and slice-encoded (SE) dimensions;
      said sequences of NMR echoes being elicited by respectively corresponding single-shot RF pulse sequences that each have an excitation RF pulse followed by plural refocusing RF pulses; and
      said refocusing RF pulses having variable flip angles in at least one of the PE and SE dimensions, and
   at least one digital data processor configured to reconstruct a 3D diagnostic NC-MRA image from said elicited systolic and diastolic sequences of NMR echoes.

2. The MRI system of claim 1, wherein said refocusing RF pulses have variable flip angles in both the PE and SE dimensions.

3. The MRI system of claim 2, wherein said single-shot RF pulse sequences have variable repetition time (TR) intervals in the SE dimension.

4. The MRI system of claim 3, wherein said TR intervals are longer when eliciting NMR echoes for a center portion of k-space than TR intervals used to elicit NMR echoes elsewhere in k-space.

5. The MRI system of claim 4, wherein said refocusing RF pulses have larger flip angles when eliciting NMR echoes for a center portion of k-space than flip angles used to elicit NMR echoes elsewhere in k-space.

6. The MRI system of claim 3, wherein said TR intervals are longer when eliciting NMR echoes for a center portion of k-space than TR intervals used to elicit NMR echoes elsewhere in k-space.

7. The MRI system of claim 6, wherein said refocusing RF pulses have larger flip angles when eliciting NMR echoes for a center portion of k-space than TR intervals used to elicit NMR echoes elsewhere in k-space.

8. The MRI system of claim 3, wherein said TR intervals including at least three different interval lengths where a third TR interval length of a intermediate imaging slice located in the 3D volume between a first imaging slice in a center portion of k-space having a first TR interval length and a second imaging slice in a peripheral portion having a second TR interval length, is longer than the first TR interval length and shorter than the second TR interval length.

9. The MRI system of claim 2 wherein said refocusing RF pulses have larger flip angles when eliciting NMR echoes for a center portion of k-space than flip angles used to elicit NMR echoes elsewhere in k-space.

10. The MRI system of claim 9, wherein at least one imaging slice having sizes of refocusing flip angles to be substantially symmetrically distributed about a refocusing pulse which has its corresponding responsive echo signal mapped nearest the center of k-space.

11. The MRI system of claim 1, wherein said refocusing RF pulses have larger flip angles when eliciting NMR echoes for a center portion of k-space than flip angles used to elicit NMR echoes elsewhere in k-space.

12. The MRI system of claim 11, wherein said single-shot RF pulse sequences have variable TR intervals the SE dimension.

13. The MRI system according to claim 1, wherein the respectively corresponding single-shot RF pulse sequences include plural first RF pulse sequences applied to the object during a first cardiac phase and plural second RF pulse sequences applied to the object during a second cardiac phase, said first and second RF pulse sequences having a same pattern of refocusing flip angles, and wherein the same pattern includes at least two different refocusing flip angle values
   wherein the at least one digital data processor is configured to receive first data sets of k-space mapped digital data corresponding to said NMR echoes responsive to the first RF pulse sequences and second data sets of k-space mapped digital data corresponding to said NMR echoes responsive to the second RF pulse sequences, and
   wherein the diagnostic image is reconstructed based upon the first data sets and the second data sets.

14. The MRI system of claim 13, wherein the RF pulse sequences comprise 3D Fast Advanced Spin Echo (3D FASE) or 3D single-shot Fast Spin Echo (3D SS-FSE) pulse sequences in combination with a half-Fourier technique for acquiring k-space data.

15. The MRI system of claim 14, wherein the RF pulse sequences further comprise flow-spoiled readout gradients.

16. The MRI system of claim 1, wherein the first and second plural RF pulse sequences are applied without infusing the object with a contrast agent, and wherein the diagnostic image provides a "bright blood" image.

17. A magnetic resonance imaging (MRI) method for effecting non-contrast magnetic resonance angiography (NC-MRA) of a three dimensional (3D) volume, the method comprising:
   eliciting systolic and diastolic sequences of nuclear magnetic resonance (NMR) echoes from an object which map to a three-dimensional (3D) k-space having phase-encoded (PE) and slice-encoded (SE) dimensions;
   said sequences of NMR echoes being elicited by respectively corresponding single-shot RF pulse sequences that each have an excitation RF pulse followed by plural refocusing RF pulses;
   said refocusing RF pulses having variable flip angles in at least one of the PE and SE dimensions; and
   reconstructing a 3D diagnostic NC-MRA image from said elicited systolic and diastolic sequences of NMR echoes.

18. The MRI method of claim 17, wherein said refocusing RF pulses have variable flip angles in both the PE and SE dimensions.

19. The MRI method of claim 18, wherein said single-shot RF pulse sequences have variable repetition time (TR) intervals in the SE dimension.

20. The MRI method of claim 19, wherein said TR intervals are longer when eliciting NMR echoes for a center portion of k-space than TR intervals used to elicit NMR echoes elsewhere in k-space.

* * * * *